(12) United States Patent
Tanaka

(10) Patent No.: US 7,301,258 B2
(45) Date of Patent: Nov. 27, 2007

(54) PIEZOELECTRIC RESONATOR ELEMENT, PIEZOELECTRIC RESONATOR, AND PIEZOELECTRIC OSCILLATOR

(75) Inventor: Masako Tanaka, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 344 days.

(21) Appl. No.: 11/048,936

(22) Filed: Feb. 3, 2005

(65) Prior Publication Data

US 2005/0200240 A1 Sep. 15, 2005

(30) Foreign Application Priority Data

| Feb. 5, 2004 | (JP) | ............................. 2004-029498 |
| Nov. 12, 2004 | (JP) | ............................. 2004-328590 |
| Feb. 1, 2005 | (JP) | ............................. 2005-025626 |

(51) Int. Cl.
*H03H 9/54* (2006.01)
(52) U.S. Cl. .................................................. 310/320
(58) Field of Classification Search ................ 310/333, 310/320–321, 366, 367–368; 333/189, 187; *H01L 41/08; H03H 9/54*
See application file for complete search history.

(56) References Cited

U.S. PATENT DOCUMENTS

| 5,091,671 | A | * | 2/1992 | Yoshida | ....................... 310/320 |
| 5,159,301 | A | * | 10/1992 | Kaida et al. | ................. 333/187 |
| 5,648,746 | A | * | 7/1997 | Kaida | .......................... 310/368 |
| 6,518,688 | B1 | * | 2/2003 | Sasaki | ......................... 310/320 |
| 7,012,355 | B2 | * | 3/2006 | Oda et al. | ................... 310/320 |

FOREIGN PATENT DOCUMENTS

| JP | U 59-108330 | 7/1984 |
| JP | U 59-183025 | 12/1984 |
| JP | A 08-228121 | 9/1996 |
| JP | A 09-093076 | 4/1997 |
| JP | A 2001-257558 | 9/2001 |
| JP | A 2003-046366 | 2/2003 |

* cited by examiner

*Primary Examiner*—Darren Schuberg
*Assistant Examiner*—Karen B Addison
(74) *Attorney, Agent, or Firm*—Oliff & Berridge, PLC

(57) ABSTRACT

Aspects of the invention provide piezoelectric resonator element having a plurality of grooves for suppressing propagation of the thickness shear vibration from the center portion to the outer peripheral portion of the main surface being placed in enclosure-like shapes surrounding the center portion of at least one of the main surfaces.

9 Claims, 15 Drawing Sheets

PIEZOELECTRIC RESONATOR ELEMENT, PIEZOELECTRIC RESONATOR, AND PIEZOELECTRIC OSCILLATOR

BACKGROUND OF THE INVENTION

1. Field of Invention

Aspects of the invention relate to the shape of a piezoelectric resonator element for preventing a thickness shear vibration, which is the main vibration, from being propagated to the outer peripheral portion of the piezoelectric resonator element.

2. Description of Related Art

Regarding a thickness shear vibration, which is the main vibration of an AT cut quartz crystal resonator, although the placement of an excitation electrode is decided so that the center portion of the resonator element oscillates, the thickness shear vibration oscillating in the center portion can be propagated to the outer peripheral portion of the resonator element.

The resonator element is held by fixing the outer peripheral portion of the resonator element to a housing made of ceramic or the like, and the propagated vibration can be suppressed because of fixing. This suppression of the propagated vibration has an effect on the thickness shear vibration, which is the main vibration. As a result, the crystal impedance (referred to as "CI value" hereinafter) decreases and other vibration modes are induced to decrease the stability of oscillation frequency.

Related art methods for suppressing propagation of the thickness shear vibration to the outer peripheral portion of the resonator element by providing a groove that surrounds an excitation electrode placed on the main surface of the resonator element and is located between the excitation electrode and the outer peripheral portion of the resonator element to dampen the vibration are disclosed, for example, in Japanese Unexamined Patent Publication No. 2001-257558 and Japanese Unexamined Patent Publication No. Hei9-93076. Incidentally, the patents do not provide any disclosure on the depth, shape, and location of the groove.

SUMMARY OF INVENTION

According to the structure indicated in the above background, however, providing a groove outside the excitation electrode results in abrupt dampening of the vibration in the closest proximity to the vibration region of the resonator element. The electrical characteristics of the main vibration are affected by this abrupt dampening of the vibration. The structure therefore has problems. For example, a large frequency variable range cannot be obtained because an equivalent capacitance $C_1$ decreases.

An exemplary piezoelectric resonator element according to the invention has main surfaces on which an excitation electrode for causing the vibration of a piezoelectric substrate is formed on two sides of the piezoelectric substrate such that a thickness shear vibration is the main vibration. The piezoelectric resonator element can include a plurality of grooves for suppressing propagation of the thickness shear vibration from the center portion to the outer peripheral portion of the main surface to be placed in enclosure-like shapes surrounding the center portion of at least one of the main surfaces.

In the piezoelectric resonator element of the invention, placing a plurality of grooves to be in enclosure-like shapes surrounding the center portion of the main surface causes gradual dampening of the thickness shear vibration from the center portion toward the outer peripheral portion of the main surface in every direction of the resonator element. It therefore becomes possible to prevent electrical characteristics of the main vibration from being affected by abrupt dampening of the vibration and therefore to secure a frequency variable range.

Desirably the width of the groove located nearest the outer periphery of the main surface among the plurality of grooves is equal to or larger than the thickness of the piezoelectric substrate. In this manner, it becomes possible to surely suppress propagation of the thickness shear vibration from the center portion to the outer peripheral portion by the groove formed nearest the outer periphery.

Desirably a groove that is different from one groove is placed along a part of the one groove in the direction of supporting the piezoelectric resonator element. In this manner, it becomes possible to further enhance the suppression of the vibration in the direction of supporting the resonator element and therefore to further reduce the effect of supporting the resonator element on the main vibration.

Desirably the plurality of grooves are formed to be three or more grooves such that an interval between grooves adjacent to each other becomes successively narrower as the interval moves from the center portion toward the outer peripheral portion of the main surface. In this manner, it becomes possible not to cause abrupt dampening in the portion near the main vibration, and therefore to reduce the effect on electrical characteristics of the main vibration.

Desirably the plurality of grooves are formed such that a groove width becomes successively wider as the groove moves from a groove nearest the center portion toward the outer peripheral portion. In this manner, it becomes possible not to cause abrupt dampening in the portion near the main vibration and therefore to reduce the effect on electrical characteristics of the main vibration.

The exemplary piezoelectric resonator element according to the invention has main surfaces on which the excitation electrode for causing the vibration of the piezoelectric substrate is formed on two sides of the piezoelectric substrate such that the thickness shear vibration is the main vibration, the piezoelectric resonator element comprising a groove for suppressing propagation of the thickness shear vibration from the center portion to the outer peripheral portion of the main surface to be placed in enclosure-like shapes surrounding the center portion of at least one of the main surfaces, and the width of the groove is equal to or larger than the thickness of the piezoelectric substrate.

In the piezoelectric resonator element of the invention, by placing one groove having a width equal to or larger than the thickness of the piezoelectric substrate, propagating the thickness shear vibration of the center portion of the main surface to the outer peripheral portion can be suppressed to the level of not affecting the main vibration. Additionally, by placing the groove in an enclosure-like shape surrounding the center portion of the main surface, the propagation of the vibration can be suppressed in every direction of the resonator element. In other words, in the piezoelectric resonator element of the invention, propagating the thickness shear vibration of the center portion of the main surface to the outer peripheral portion can be suppressed in every direction of the resonator element to the level of not affecting the main vibration.

An excitation electrode in an arbitrary shape and a supporting electrode connected to the excitation electrode may be formed at least on the above described center portion of the main surface of the piezoelectric resonator element.

Providing a piezoelectric resonator that includes the above described piezoelectric resonator element according to the invention, and a holding portion fixing and connecting the piezoelectric resonator element becomes possible.

Providing a piezoelectric oscillator that comprises the above described piezoelectric resonator element according to the present invention, a circuit portion for driving the piezoelectric resonator element, and a holding portion having a fixing portion that fixes and connects the piezoelectric resonator element and the circuit portion becomes possible.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Prior to description of the exemplary embodiments, the vibration principle of a piezoelectric resonator element according to the invention will be described in the case of an AT cut quartz crystal resonator (referred to as a resonator element hereinafter).

The propagation of the vibration is expressed by formulas (1) to (4). According to the expressions (1) to (4), if there are regions having different frequency in the same resonator element, the vibration is propagated from the region having high frequency to the region having low frequency, whereas, from the region having low frequency to the region having high frequency, the vibration is damped in accordance with the propagation distance because $\alpha$ and $\beta$ are imaginary numbers.

[Formula 1] (1)
$$U = B \cdot \exp[-j(\omega 1 - (\alpha x + \beta z'))]$$

[Formula 2] (2)
$$\alpha x = \left(\frac{\pi x}{2b}\right)\left(\frac{\gamma_{t1}}{C_{66}} + \frac{\alpha^2}{12}\right)^{-\frac{1}{2}}\left[\left(\frac{\omega}{\omega_s}\right)^2 - 1\right]^{\frac{1}{2}}$$

[Formula 3] (3)
$$\gamma_{t1} = \frac{s_{33}}{s_{11}s_{33} - s_{13}^2}$$

[Formula 4] (4)
$$\beta z' = \left(\frac{\pi z'}{2b}\right)\left(\frac{C_{66}}{C_{55}}\right)^{\frac{1}{2}}\left[\left(\frac{\omega}{\omega_s}\right)^2 - 1\right]^{\frac{1}{2}}$$

where U: displacement of a thickness shear vibration to the X and Z' directions; B: amplitude;

ω, ω$_s$: angular frequency of a mesa portion and angular frequency of a resonator element;

α, β: propagation constants in the X and Z' directions, respectively; $C_{55}$, $C_{66}$: elastic stiffness (constants in a matrix expressing a modulus of elasticity in the predetermined crystal orientation);

$S_{11}$, $S_{13}$, $S_{33}$: elastic compliance (constants in a matrix expressing a modulus of elasticity in the predetermined crystal orientation);

j: imaginary unit; t: time; x: distance in the X direction; z': distance in the Z' direction.

A portion having high frequency can be made by forming a groove in a resonator element using the above expressions so that the vibration is effectively damped at the peripheral edge of the resonator element. Not only the damping of the vibration at the peripheral edge of the resonator element, but also electrical characteristics can be considered as the resonator element. In other words, regarding a groove in the resonator element, analysis of the most appropriate groove structure by the use of the above expressions (1) to (4) by a finite element method (FEM), considering the point of view of full dampening of the vibration at the peripheral edge of the resonator element and the problem that an unwanted mode occurs when a region having low frequency is completely mechanically separated.

The preferred embodiments of a piezoelectric resonator element according to the invention will be described below by the use of the accompanying drawings. Incidentally, it should be understood that the invention is not restricted to the exemplary embodiments described below.

Figure 1A:
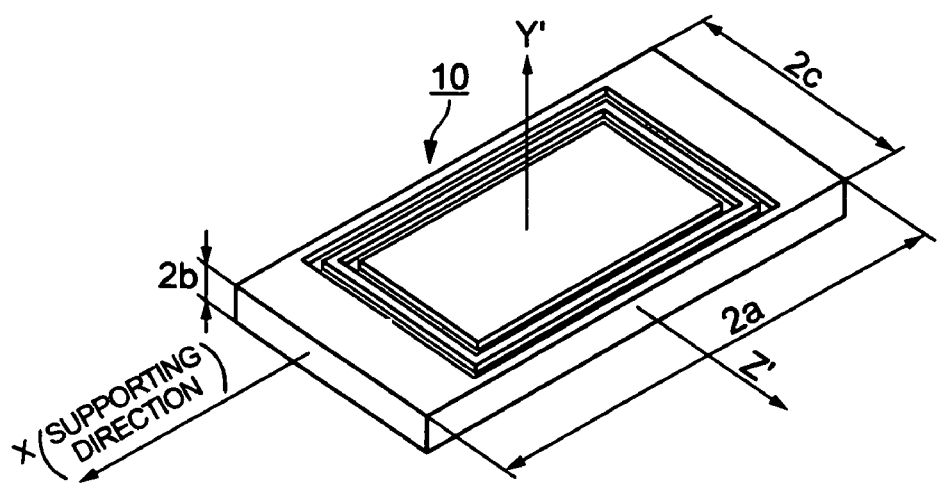
FIGS. 1A, 1B, and 1C are schematic views for explaining a resonator element of a first exemplary embodiment of the invention.
Figure 1B:
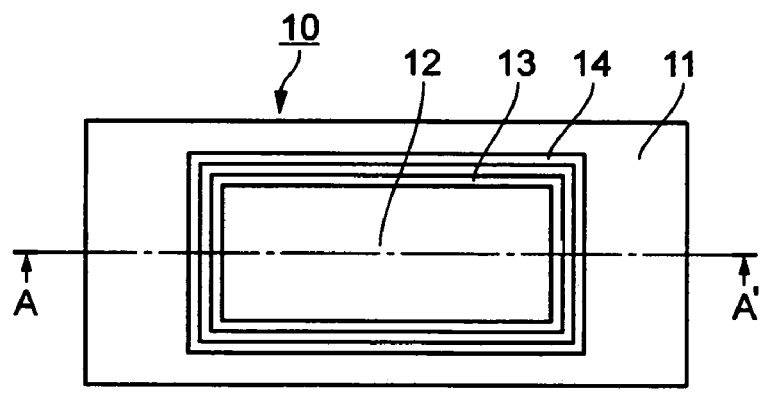
Figure 1C:
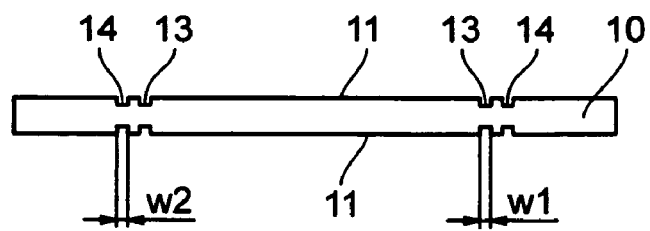

A resonator element including a quartz crystal having two grooves in enclosure shapes (double groove) as an example of a piezoelectric resonator element of the present invention will be described in accordance with FIGS. 1A, 1B, and 1C. FIGS. 1A, 1B, and 1C are schematic views of the resonator element for explaining a first exemplary embodiment; FIG. 1A is a perspective view of the resonator element, FIG. 1B is a plan view of the resonator element, and FIG. 1C is a sectional view taken along lines A-A' of FIG. 11B.

A piezoelectric substrate will be described using an AT cut quartz crystal resonator element 10 having the resonance frequency of 27 MHz, the X side ratio to the substrate's thickness of 33, and the Z side ratio to the substrate's thickness of 21 as an example. The Y'-axis and the Z'-axis of the resonator element 10 of the present embodiment correspond to new coordinate axes made by rotating clockwise at 35.25 degrees in the +X direction around the X-axis under the definition of the crystallographic axis in accordance with IEC standards. The shape of the resonator element 10 is a flat plate in a rectangular shape with a thickness 2b in the Y'-axis direction. Two sides of the resonator element 10 have main surfaces 11 that have a longitudinal length 2a of the resonator element 10 in the direction of the X-axis, which is normal to the Z'-axis (the supporting direction of the resonator element 10 in the present embodiment), and a width 2c of the resonator element 10 in the direction of the Z'-axis, which is normal to the X-axis.

In each of the main surfaces 11 disposed on two sides of the resonator element 10, two grooves, an inside groove 13 (groove width w1) and an outside groove 14 (groove width w2), which surround a center portion 12 of the main surface 11 and are in enclosure shapes substantially along the outer shape of the resonator element 10 are placed. The inside groove 13 and the outside groove 14 are formed such that the groove widths, w1 and w2, are 50 µm and the depths are 3 µm.

Figure 2:
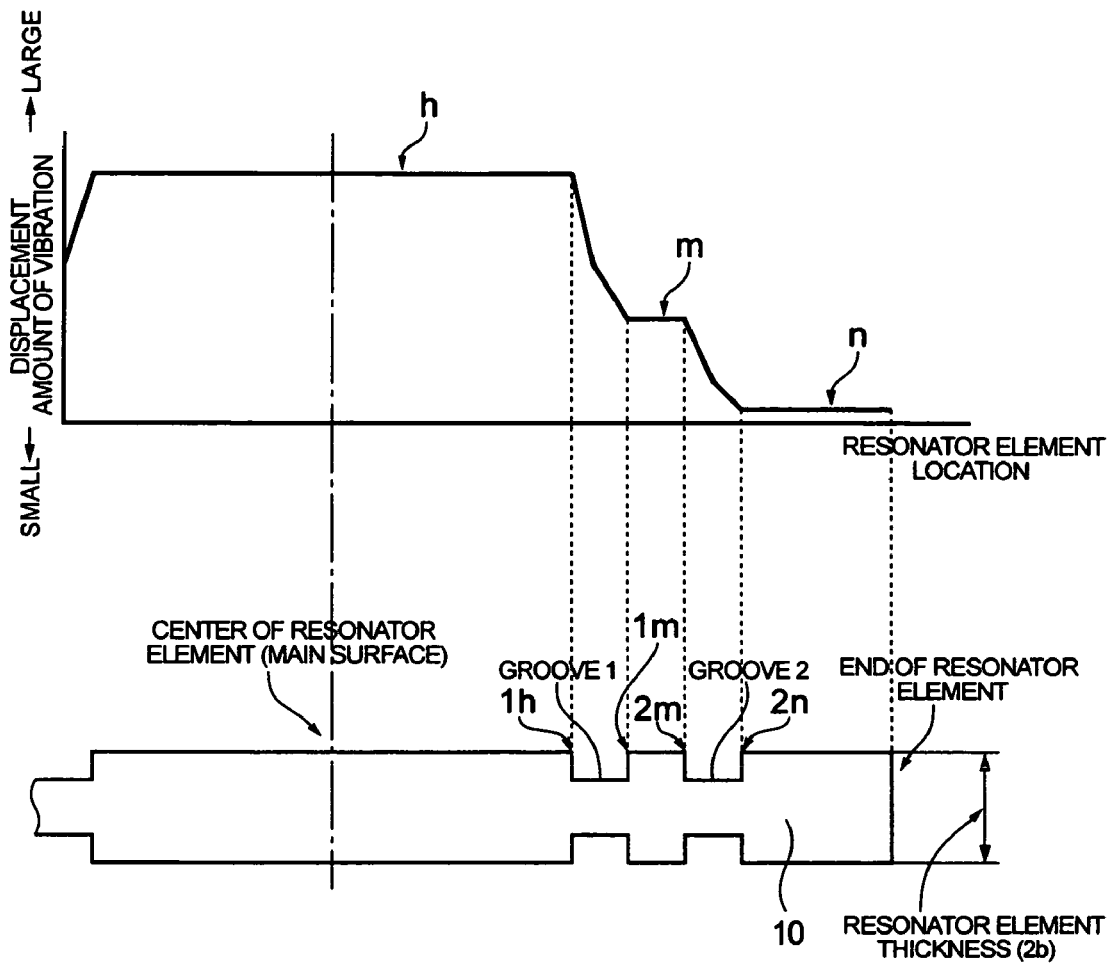
FIG. 2 is a diagrammatic view illustrating dampening of a thickness shear vibration that is the main vibration of a resonator element of the invention.

Damping of the thickness shear vibration of the resonator element by the use of a plurality of grooves of the first embodiment will be now described by using FIG. 2. FIG. 2 is a diagrammatic view showing dampening of the thickness shear vibration, which is the main vibration of the resonator element. Incidentally, in the exemplary embodiment, an example of dampening the thickness shear vibration by two grooves up to the displacement amount of the vibration with which characteristics of the thickness shear vibration, which is the main vibration, are not affected even though the outer peripheral portion of the resonator element is held will be described.

According to FIG. 2, the thickness shear vibration has the largest amount of displacement (h) in the center portion of the resonator element 10. The vibration is damped by the grooves 1 and 2 placed in the resonator element. Dampening of the thickness shear vibration begins from the inner peripheral side edge (1h) of the groove 1 placed in the resonator element, and continues to the outer peripheral side edge (1m) until the amount of displacement reaches the predetermined value. Between the groove 1 and the groove 2, that is, in the portion without a groove at the outer peripheral side of the groove 1, damping of the vibration that has continued by the groove 1 stops for a while, and the amount of displacement (m) nearly does not change and continues to the location of the groove 2. Subsequently, dampening of the thickness shear vibration begins again from the inner peripheral side edge (2m) of the groove 2 and continues to the outer peripheral side edge (2n) of the groove 2. Then, since the flat portion instead of the groove portion continues, the amount of displacement (n) of the vibration nearly does not change and continues at the small level.

Figure 5A:
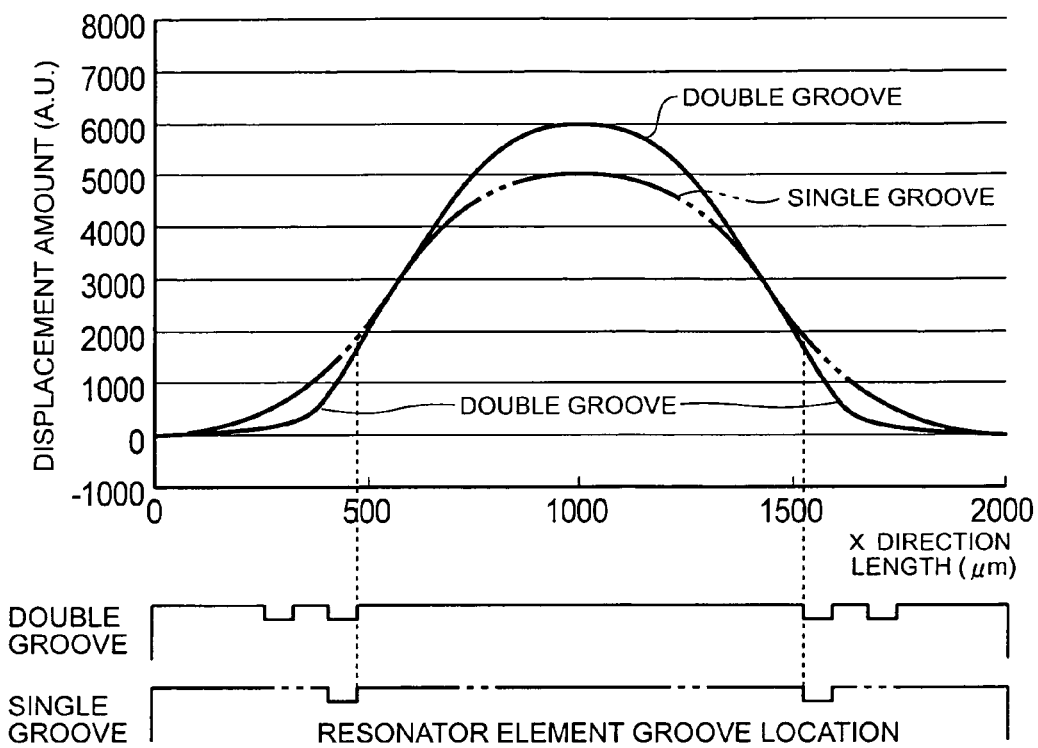
FIGS. 5A and 5B are graphs that show the calculated result of a displacement distribution by a finite element method (FEM) illustrating dampening of a thickness shear vibration of a first exemplary embodiment of the invention.
Figure 5B:
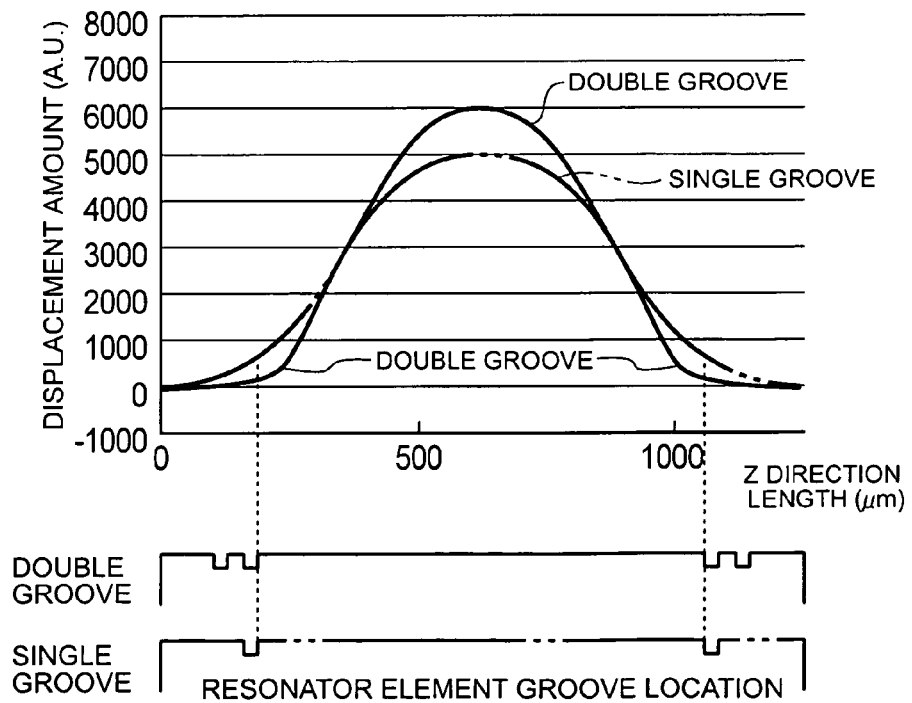

FIGS. 5A and 5B are the calculated result of the displacement distribution by a finite element method (FEM) of the exemplary embodiment. The vertical axes used in FIGS. 5A and 5B are expressed in an arbitrary unit (Arbitrarily Unit) for comparison of the amounts of displacement. The horizontal axes indicate the length in the X direction of the resonator element 10.

According to the calculated result of the displacement distribution by a finite element method (FEM) of the embodiment shown in FIGS. 5A and 5B, both the displacement distribution in the X-axis direction (the supporting direction of the resonator element) in FIG. 5A and the displacement distribution in the Z'-axis direction in FIG. 5B show dampening by two grooves. It is shown that the displacement amount of the vibration almost disappears in the outer peripheral edge portion of the resonator element while the vibration displacement of the main vibration portion is secured.

According to the exemplary embodiment, placing a plurality of grooves in enclosure-like shapes surrounding the center portion of the resonator element enables gradual dampening of the thickness shear vibration from the center portion toward the outer peripheral portion of the main surface in every direction of the resonator element. It therefore becomes possible to dampen the vibration up to the value that does not have an effect on the thickness shear vibration, which is the main vibration, even though the outer peripheral portion of the resonator element is fixed, without causing abrupt dampening of the vibration in the portion near the main vibration. Additionally, formation of a plurality of grooves in enclosure shapes at the same depth allows simultaneous formation of the plurality of grooves by etching and other processing.

Figure 3A:
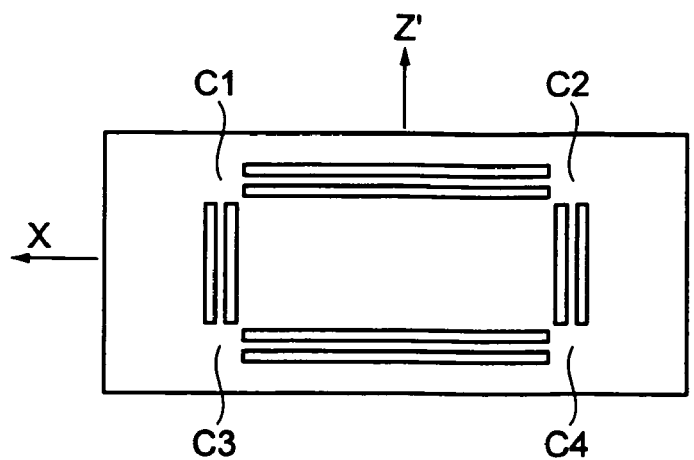
FIGS. 3A, 3B, and 3C are schematic views showing applications of the shape of grooves of a resonator element in a first exemplary embodiment of the invention.
Figure 3B:
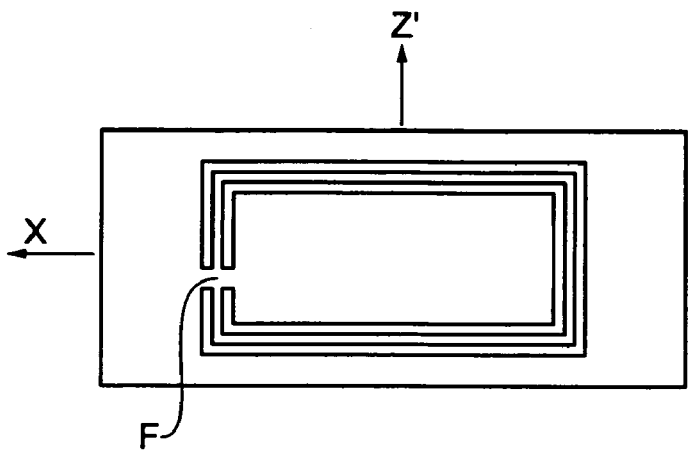
Figure 3C:
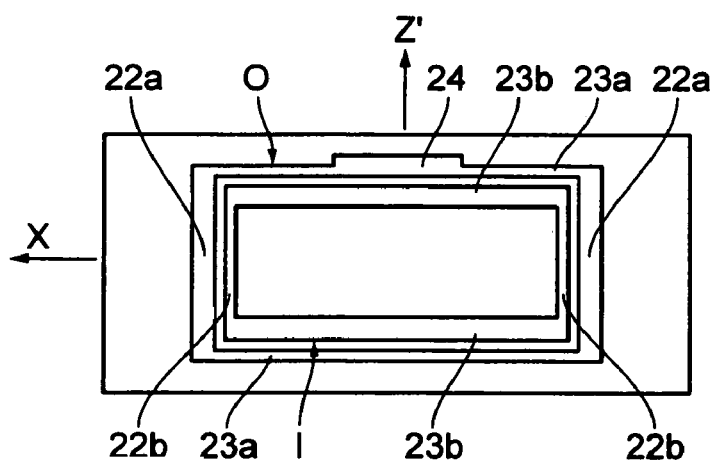

FIGS. 3A, 3B, and 3C are plan views of the resonator element that show modifications having a plurality of grooves in the resonator element. The plurality of grooves may be constructed such that a portion of the plurality of grooves placed in enclosure shapes does not have a groove as shown in FIGS. 3A and 3B. FIG. 3A shows a construction without grooves in four corners C1, C2, C3, and C4, and FIG. 3B shows a construction containing a portion F that does not have a groove in a portion in the Z'-axis direction. Incidentally, the location and number of portions without grooves can be arbitrarily determined unless it affects dampening of the vibration.

The plurality of grooves may be ones that do not have constant widths and have a portion that is partially wide as shown in FIG. 3C. According to FIG. 3C, in a groove O at the outer peripheral side, the width of a groove 23a placed along the Z'-axis direction is less than the width of a groove 22a placed along the X-axis, and in a groove I at the center portion side, the width of a groove 22b placed along the Z'-axis direction is less than the width of a groove 23b placed along the X-axis.

The groove may have a portion 24 that is partially wide in the middle of a side of a rectangle and may also have a portion not shown in the drawing where the width of the groove is partially narrow.

Figure 4A:
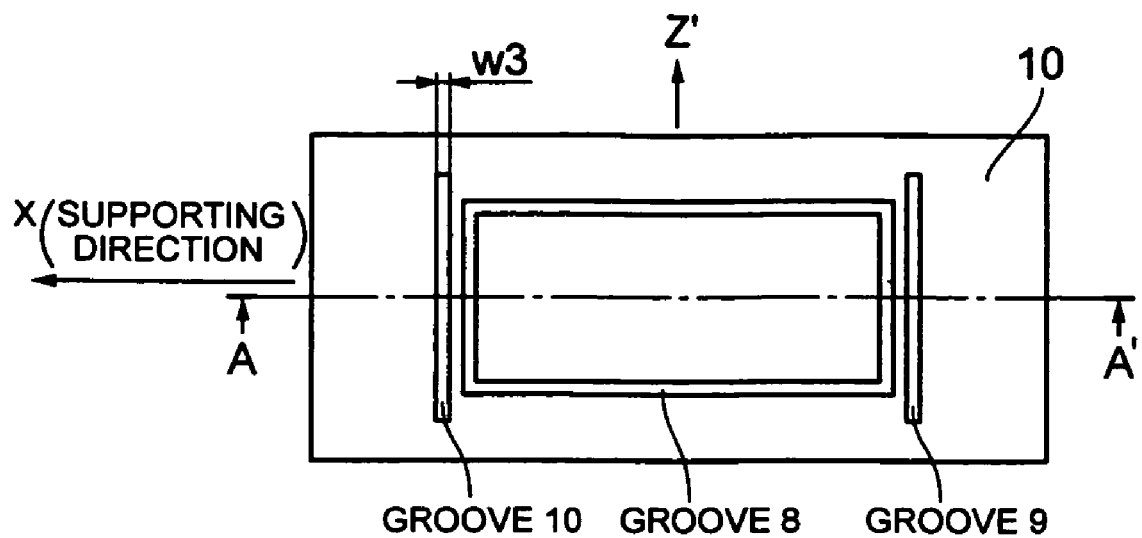
FIGS. 4A and 4B are schematic views showing an application of the shape of grooves of a resonator element in a first exemplary embodiment of the invention.
Figure 4B:
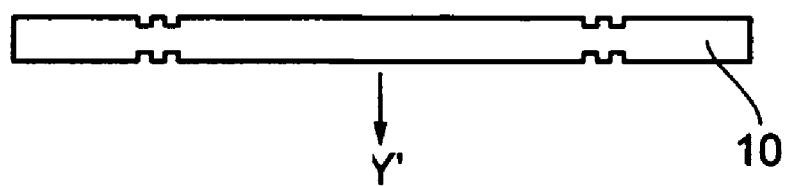

FIGS. 4A and 4B are schematic views showing other modifications, where FIG. 4A is a plan view of the resonator element and FIG. 4B is a sectional view taken along lines A-A' of FIG. 4A. As shown in FIGS. 4A and 4B, a construction such that a groove 8 is placed in an enclosure shape for surrounding the center portion of the resonator element 10 and grooves 9 and 10 (groove width w3) are placed at the locations substantially along the groove 8 (at the outer peripheral side of the groove 8 in the embodiment) in the direction in which abrupt depending must be avoided (the supporting direction of the resonator element in the embodiment).

Incidentally, it is recommended that the grooves 9 and 10 do not reach the outer periphery of the resonator element 10 and have edges in the resonator element 10. This can prevent a breakdown (breaking, crack) of the resonator element due to a shock from the outside by securing the thickness of the outer peripheral portion of the resonator element and preventing stress concentration from occurring in the portion of the groove that reaches the edge face of the resonator element 10.

Figure 6A:
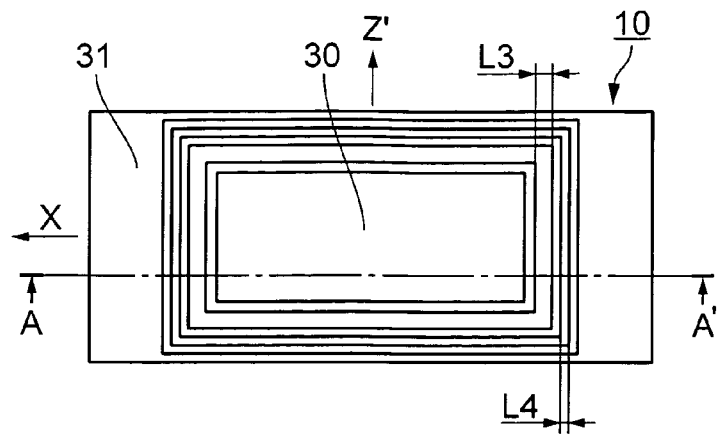
FIGS. 6A and 6B are schematic views of a quartz crystal resonator element for explaining a second exemplary embodiment of the invention.
Figure 6B:
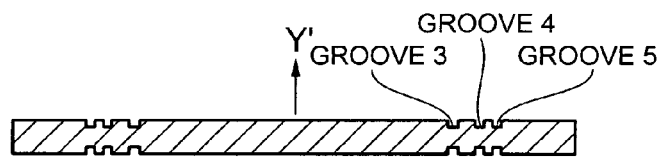

The resonator element composed of quartz crystal having different intervals between grooves placed in enclosure shapes as an embodiment of the piezoelectric resonator element of the invention will be described by the use of FIGS. 6A and 6B. FIGS. 6A and 6B are schematic views of the resonator element for explaining a second exemplary embodiment, where FIG. 6A is a plan view of the resonator element and FIG. 6B is a sectional view taken along lines A-A' of FIG. 6A.

As shown in FIGS. 6A and 6B, the resonator element can include three grooves (triple groove), that is, a groove 3 near the center portion 30 of the resonator element 10, a groove 5 near the outer peripheral portion 31 of the resonator element 10, and a groove 4 located between the groove 3 and the groove 5, which are formed such that an interval L3 between two grooves, the grooves 3 and 4, near the center portion 30 of the resonator element, is larger than an interval L4 between two grooves, the grooves 4 and 5, near the outer peripheral portion 31 of the resonator element (L3>L4).

Similarly, although not shown in the drawing, if four or more grooves are placed, the intervals between grooves are formed such that an interval becomes successively narrower as the groove moves from the center portion 30 toward the outer peripheral portion 31 of the resonator element 10.

Figure 7:
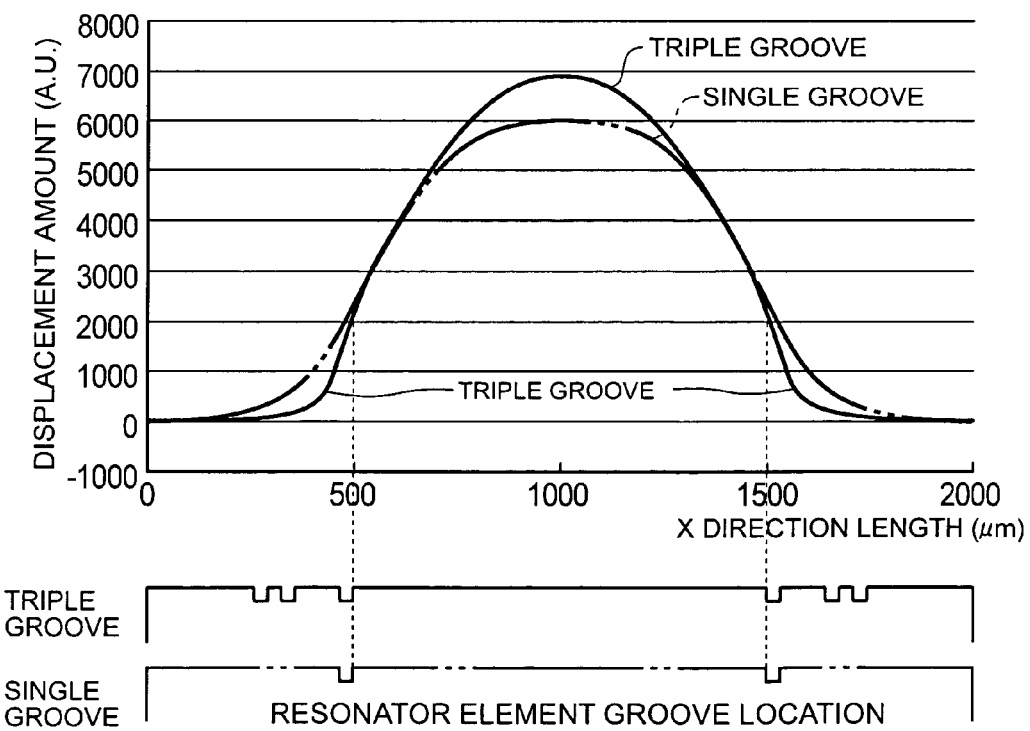
FIG. 7 is a graph that shows the calculated result of a displacement distribution by a finite element method (FEM) illustrating dampening of a thickness shear vibration of a second exemplary embodiment of the invention.

Also in FIG. 7, the calculated result of the displacement distribution in the X-axis direction (the supporting direction of the resonator element) of the piezoelectric resonator element of the present embodiment by a finite element method (FEM) is shown. From FIG. 7, it is shown that the thickness shear vibration is surely dampened and the displacement amount of the vibration almost disappears in the outer peripheral edge portion of the resonator element while the vibration displacement of the main vibration portion is secured.

The vibration can be slowly dampened in this manner by widening the intervals between grooves, that is, enlarging the region where the vibration is not dampened.

By forming the intervals between grooves to be wide in the portion adjacent to the vibration region and making the intervals successively narrower toward the outer peripheral portion in the manner of the embodiment, dampening of the vibration in the region of large vibration displacement, that is, the region adjacent to the main vibration becomes slow so that the vibration is dampened steadily toward the outer peripheral portion without causing abrupt dampening of the vibration. Accordingly, propagation of the vibration to the outer peripheral portion can be suppressed without affecting electrical characteristics of the thickness shear vibration, which is the main vibration.

Figure 8A:
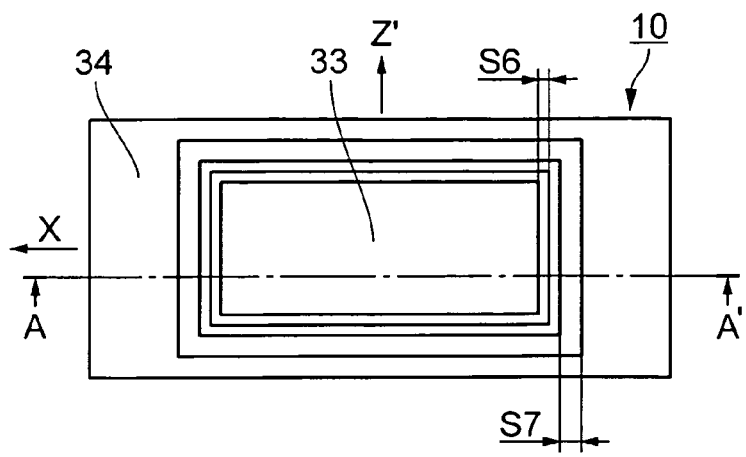
FIGS. 8A and 8B are schematic views of a resonator element for explaining a third exemplary embodiment of the invention.
Figure 8B:
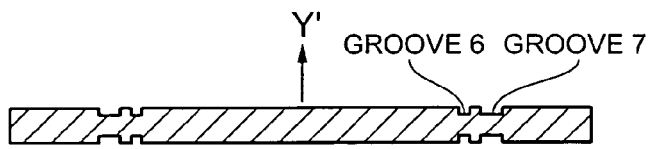

The resonator element composed of quartz crystal having different widths of a plurality of grooves placed in enclosure shapes as an embodiment of the piezoelectric resonator element of the invention will be described by the use of FIGS. 8A and 8B. FIGS. 8A and 8B are schematic views of the resonator element for explaining a third exemplary embodiment, where FIG. 8A is a plan view of the resonator element and FIG. 8B is a sectional view taken along lines A-A' of FIG. 8A.

As shown in FIGS. 8A and 8B, the groove width S6 of a groove 6 near the center portion 33 of the resonator element 10 is formed to be less than the groove width S7 of a groove 7 near the outer peripheral portion 34 of the resonator element 10 (S6<S7). Similarly, if three or more grooves are placed, the groove widths of the grooves are formed to become successively wider from the center portion 33 toward the outer peripheral portion 34 of the resonator element 10.

Figure 9:
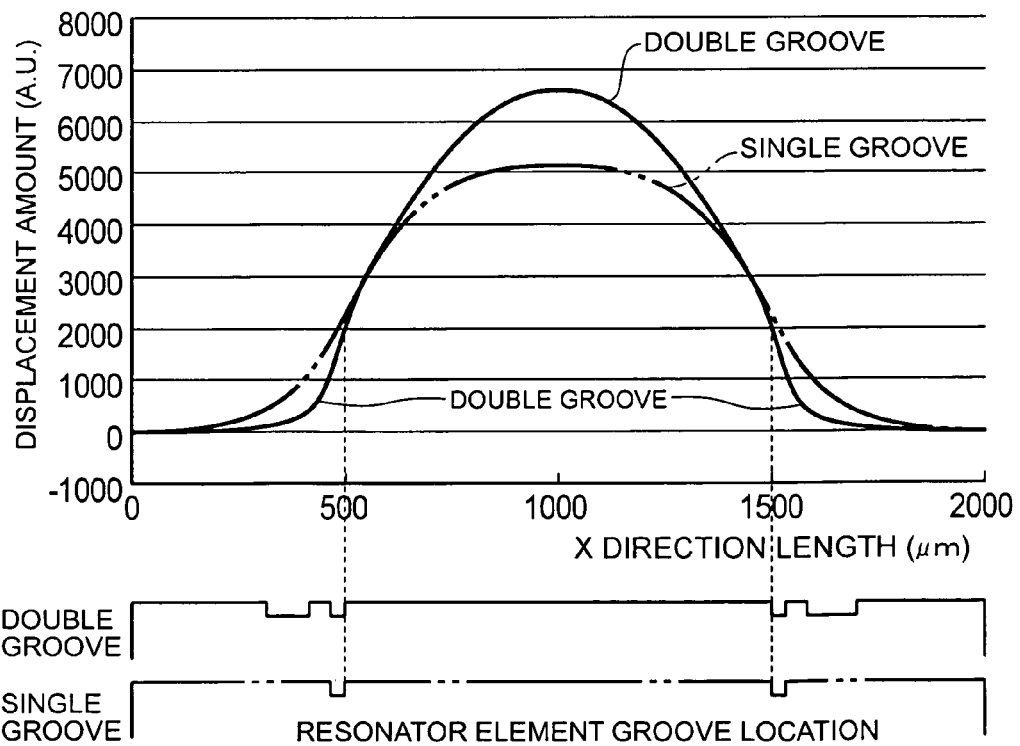
FIG. 9 is a graph that shows the calculated result of a displacement distribution by a finite element method (FEM) illustrating dampening of a thickness shear vibration of a third exemplary embodiment of the invention.

The calculated result of the displacement distribution in the X-axis direction (the supporting direction of the resonator element) of the piezoelectric resonator element of the present embodiment by a finite element method (FEM) is shown in FIG. 9. From FIG. 9, it is shown that the thickness shear vibration is surely dampened and the displacement amount of the vibration almost disappears in the outer peripheral edge portion of the resonator element while the vibration displacement of the main vibration portion is secured.

According to the embodiment, the width of the groove can be formed to be the narrowest in the portion adjacent to the main vibration region and become successively wider toward the outer peripheral portion. Therefore dampening begins on a small scale in the portion adjacent to the main vibration with large vibration displacement, and the groove width is made to be wider as the groove approaches the outer peripheral side that receives little influence from the main vibration. As a result, complete dampening can be attempted. Accordingly, abrupt dampening of the vibration in the region adjacent to the main vibration can be reduced or prevented, and propagation of the vibration to the outer peripheral portion can therefore be completely suppressed, without affecting electrical characteristics of the thickness shear vibration, which is the main vibration.

Thus, placing a plurality of grooves in enclosure-like shapes surrounding the center portion of the resonator element enables gradual dampening of the thickness shear vibration from the center portion toward the outer peripheral portion of the main surface in every direction of the resonator element. It therefore becomes possible to dampen the vibration up to the value that does not have an effect on the thickness shear vibration, which is the main vibration, even though the outer peripheral portion of the resonator element is fixed, without causing abrupt dampening of the vibration in the portion near the main vibration.

Moreover, the best dampening curve can be obtained by changing the shape and configuration of the plurality of grooves to control the state of dampening of the vibration, and making the region for dampening of the vibration smaller therefore becomes possible. That is, contribution to miniaturization of the resonator element becomes possible.

By forming the groove width of one groove (single groove) to be larger than the thickness of the resonator element instead of placing a plurality of grooves in the resonator element, propagation of the thickness shear vibration in the center portion to the outer peripheral portion of the main surface can be suppressed up to the level at which the main vibration is not affected.

Figure 10A:
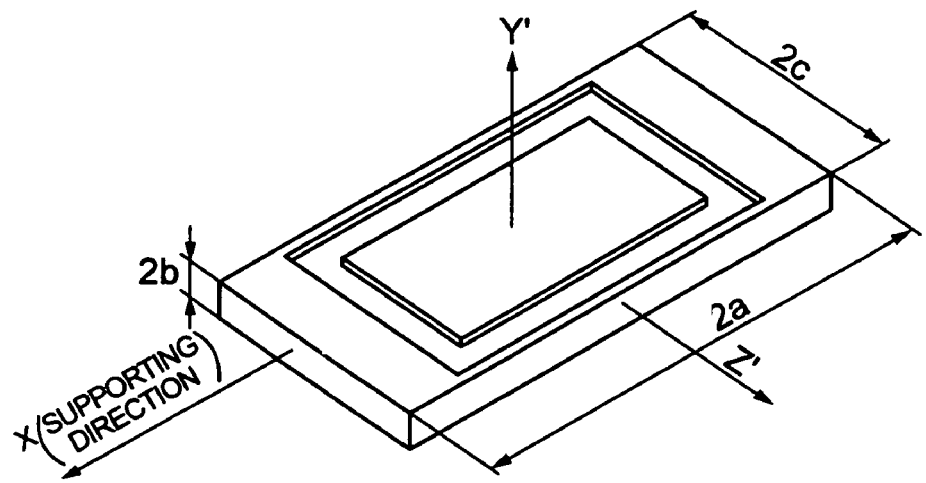
FIGS. 10A, 10B, and 10C are schematic views of a resonator element for explaining a fourth exemplary embodiment of the invention.
Figure 10B:
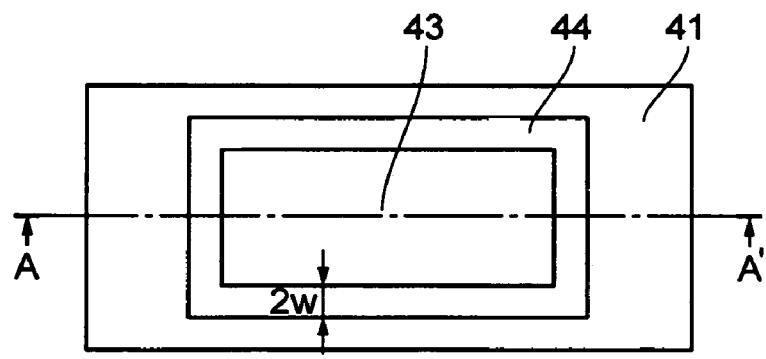
Figure 10C:
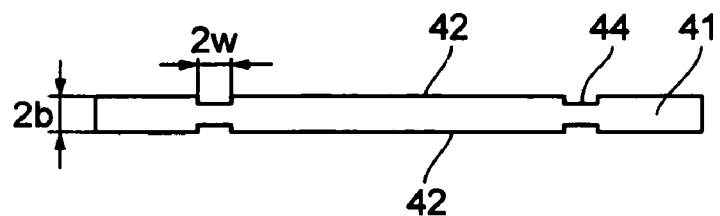

The resonator element having the groove width larger than the thickness of the resonator element as an exemplary embodiment of the piezoelectric resonator element of the invention will be described by the use of FIGS. 10A, 10B, and 10C. FIGS. 10A, 10B, and 10C are schematic views of the resonator element for explaining a fourth embodiment, where FIG. 10A is a perspective view of the resonator element, FIG. 10B is a plan view of the resonator element, and FIG. 10C is a sectional view taken along lines A-A' of FIG. 10B.

A piezoelectric substrate having a groove with a predetermined grove width on the main surface will be described using an AT cut quartz crystal resonator element 41 having the resonance frequency of 27 MHz, the fraction of the X side of 33, and the fraction of the Z side of 21 as an example. The Y'-axis and the Z'-axis of the resonator element 41 of the embodiment correspond to new coordinate axes made by rotating clockwise at 35.25 degrees in the +X direction around the X-axis under the definition of the crystallographic axis in accordance with IEC standards. The shape of the resonator element 41 is a flat plate in a rectangular shape with a thickness $2b$ in the Y'-axis direction. Two sides of the resonator element 41 have main surfaces 42 that have the longitudinal length $2a$ of the resonator element 41 in the direction of the X-axis, which is orthogonal to the Z'-axis (the direction of supporting the resonator element 41 in the present embodiment), and the width $2c$ of the resonator element 41 in the direction of the Z'-axis, which is orthogonal to the X-axis.

A groove 44 in an enclosure shape that surrounds the center portion 43 of the main surface 42 and is substantially along the outer shape of the resonator element 41 is placed in each of the main surfaces 42 disposed on two sides of the resonator element 41. The groove 44 is formed such that the groove width $2w$ is 100 μm and the depth is 3 μm.

Figure 11:
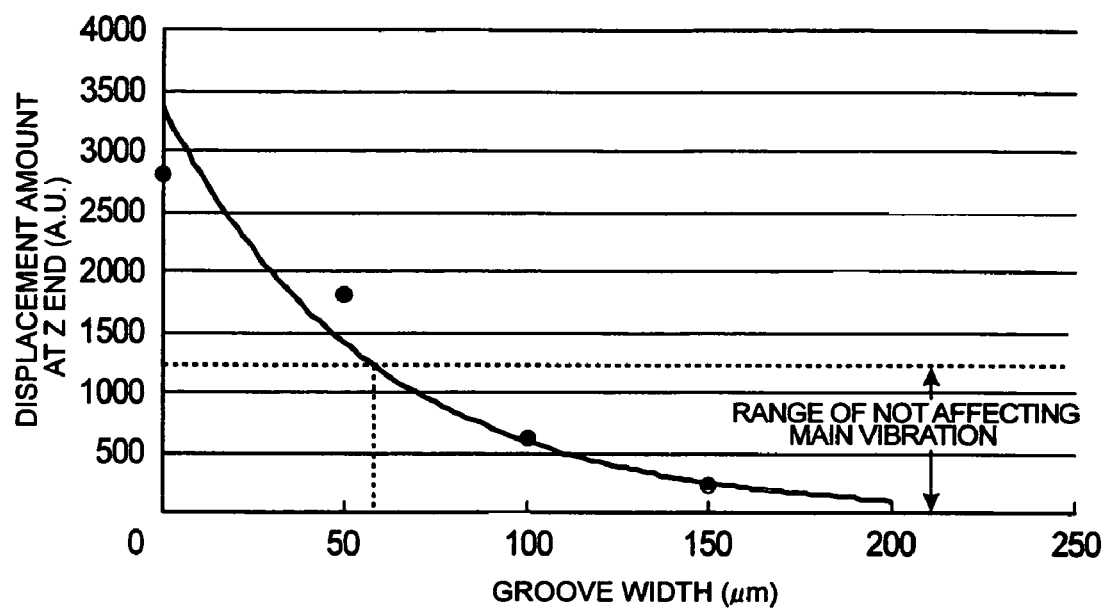
FIG. 11 is a graph that shows the correlation between the groove width and the displacement amount at the edge in the Z direction (the edge in the width direction) in a resonator element explained in a fourth exemplary embodiment of the invention.

FIG. 11 is a graph that shows the correlation between the groove width and the displacement amount at the edge in the Z' direction (the edge in the width direction) in the resonator element explained in a fourth exemplary embodiment of the invention. From FIG. 1, it is shown that the groove width at which the displacement amount in the edge portion of the resonator element can be dampened up to the level of not affecting the main vibration is around 60 μm, which is substantially identical to the thickness of the resonator element. In confirmation of the correlation with other frequency, although not shown in the drawing, it was also confirmed that the groove width allowing the vibration to be dampened up to the level at which the displacement amount in the edge portion of the resonator element does not affect the main vibration is substantially identical to the thickness of the resonator element.

Accordingly, a groove having the groove width $2w$ larger than the resonator element thickness $2b$ is placed in an enclosure-like shape surrounding the center portion of the resonator element, and the propagation of the main vibration to the outer peripheral portion of the resonator element can therefore be suppressed, so that the vibration can be dampened up to the level at which the displacement amount in the edge portion of the resonator element does not affect the main vibration.

Figure 12A:
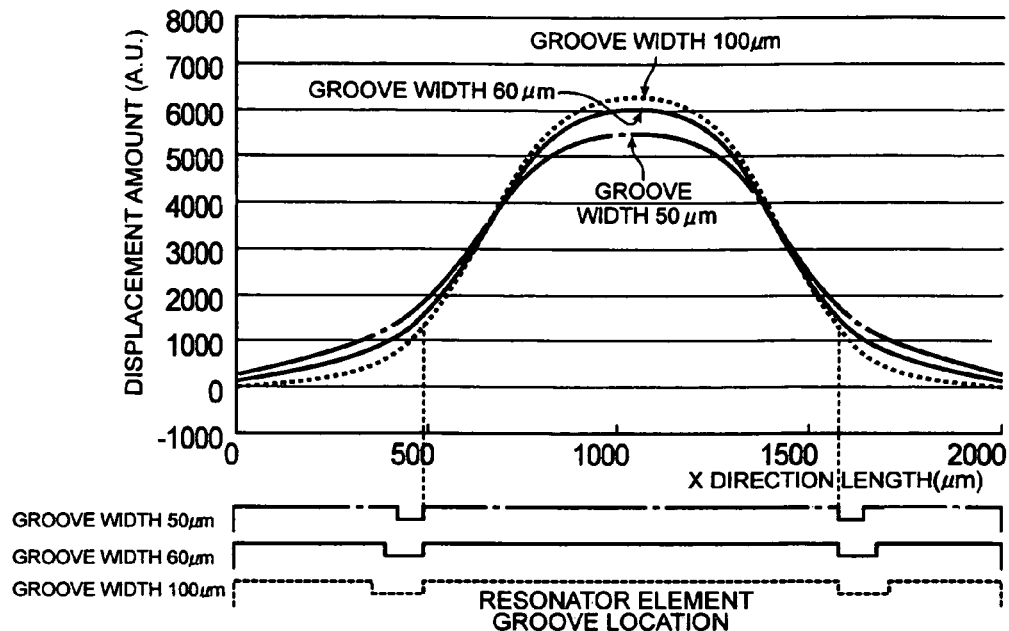
FIGS. 12A and 12B are graphs that show the calculated result of a displacement distribution by a finite element method (FEM) illustrating dampening of a thickness shear vibration of a fourth exemplary embodiment of the invention.
Figure 12B:
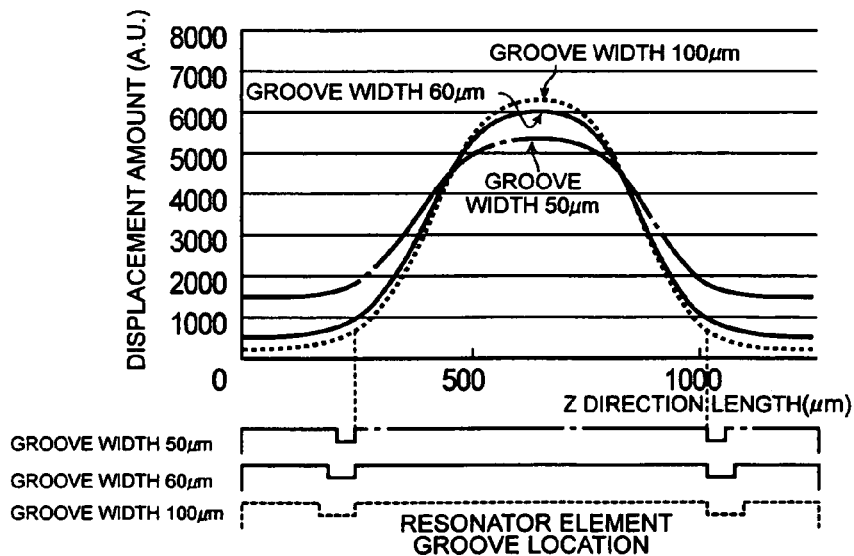

FIGS. 12A and 12B are graphs showing the calculated result of the displacement distribution in the X-axis direction (the direction of supporting the resonator element) of the piezoelectric resonator element of the embodiment by a finite element method (FEM) with each groove width. According to FIGS. 12A and 12B, there is propagation of the vibration to the outer peripheral portion of the resonator element at the groove width of 50 μm, which is less than the thickness of the resonator element, and the displacement amount of the main vibration is small due to the influence of the propagation. At the groove widths of 60 μm and 100 μm, it is shown that the thickness shear vibration is surely dampened, and the displacement amount of the vibration almost disappears in the outer peripheral edge portion of the resonator element, while the vibration displacement of the main vibration portion is secured. In this calculated result, it can also be confirmed that a groove having a groove width $2w$ larger than a thickness $2b$ of the resonator element is placed in an enclosure shape surrounding the center portion of the resonator element, and propagation of the main vibration to the outer peripheral portion of the resonator element can therefore be suppressed, so that dampening of the vibration up to the level at which the displacement amount in the edge portion of the resonator element does not affect the main vibration becomes possible.

A plurality of grooves may be formed in the main surface of the resonator element such that the width of the groove located nearest the outer periphery among the plurality of grooves is larger than the thickness of the piezoelectric substrate.

Figure 13A:
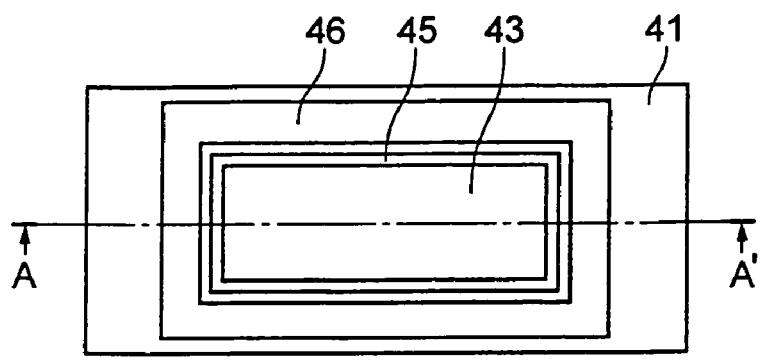
FIGS. 13A and 13B are schematic views of a resonator element for explaining a modification in a fourth exemplary embodiment of the invention.
Figure 13B:
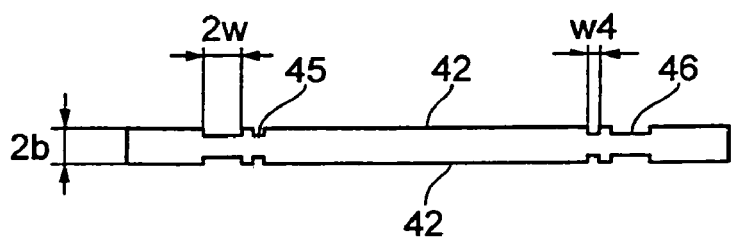

A resonator element as a modification of the piezoelectric resonator element of the invention will be described by the use of FIGS. 13A and 13B. FIGS. 13A and 13B are schematic views of the resonator element for explaining a modification of a fourth embodiment, where FIG. 13A is a plan view of the resonator element and FIG. 13B is a sectional view taken along lines A-A' of FIG. 13A.

The present modification uses the AT cut quartz crystal resonator element 41 similar to that of the fourth embodiment. Main portions for the groove will be described. Each of the main surfaces 42 disposed on two sides of the resonator element 41 has two grooves, an inside groove 45 (groove width w4) and an outside groove 46 (groove width $2w$), in enclosure shapes that surround the center portion 43 of the main surface 42 and are substantially along the outer shape of the resonator element 41. The inside groove 45 is formed such that the groove width w4 is 50 μm and the depth is 3 μm. The outside groove 46 is formed such that the groove width $2w$ is 60 μm and the depth is 3 μm. Because the groove width $2w$ of the outside groove 46 is larger than the thickness $2b$ of the resonator element 41, the groove 46 with the groove width $2w$> the resonator element thickness $2b$ is formed.

This modification thus involves both the effect of placing a plurality of grooves and the effect of making the width of the groove larger than the thickness of the resonator element, and dampening of the vibration up to the region where an effect on the main vibration does not occur therefore becomes possible. In particular, by forming the width of the groove nearest the outer periphery larger than the thickness of the resonator element, propagation of the vibration can be surely suppressed.

Figure 14:
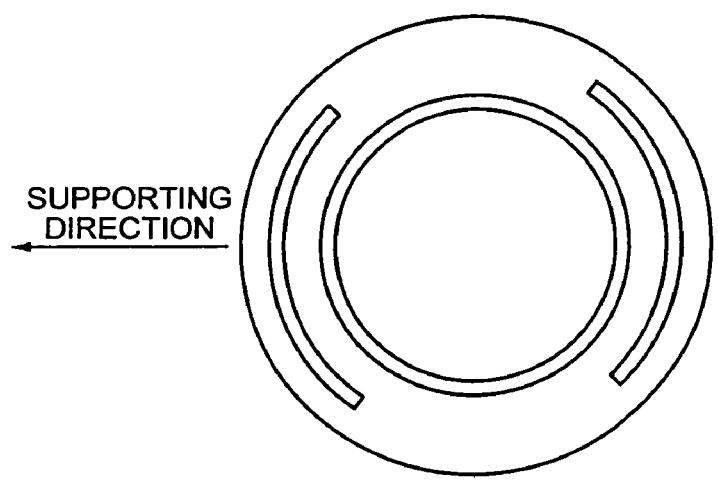
FIG. 14 is a schematic view showing an application of a resonator element according to the invention.

Incidentally, although a strip-shaped (rectangular shaped) resonator element is used in the above description, the similar structure can be used not only for the resonator element having the outer shape of a circle as shown in FIG. 14 but also for the resonator element, not shown, having the outer shape of a square or the like. Although the shape in which the circular groove at the outer peripheral side is cut in mid-course is shown in FIG. 14, the groove is not restricted to this and the outside groove may be a circular groove similar to the inside groove.

Although the above describes that the groove is placed on two sides of the main surface, not only this structure but also the structure of placing a groove on one side have the similar effect.

Although the groove in an enclosure shape is expressed in the example of forming the groove to be straight lines parallel to the outer shape of the resonator element in the above embodiment, the groove may have not only this shape but also nonlinear shape such as a curve line shape, and further the groove need not be parallel to the outer shape of the resonator element.

A piezoelectric resonator element made by using the foregoing resonator element and forming an excitation electrode for causing the thickness shear vibration and a supporting electrode connected from the excitation electrode in arbitrary shapes on the main surface placed on two sides of the resonator element can be provided. FIGS. 15A, 15B, 16A, and 16B show an exemplary embodiment in which an excitation electrode and a supporting electrode are formed as electrodes on the resonator element described in a first embodiment.

Figure 15A:
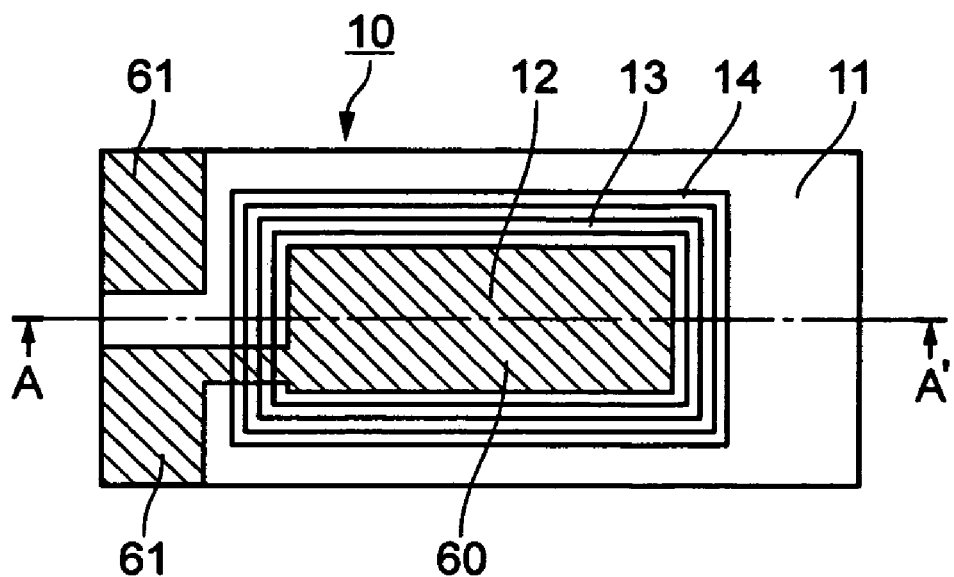
FIGS. 15A and 15B are schematic views of a resonator element for explaining a fifth exemplary embodiment of the invention.
Figure 15B:
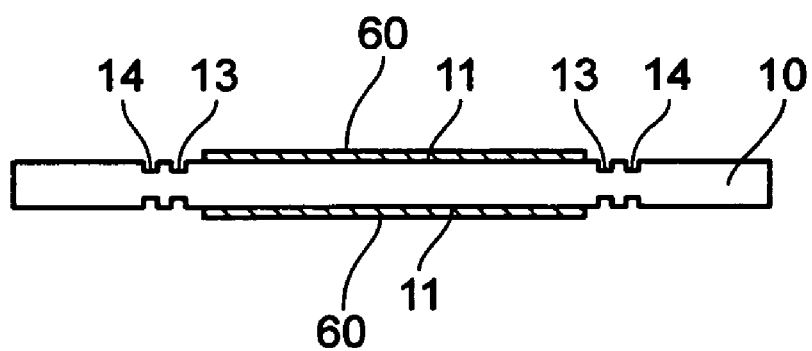

15A is a plan view of the resonator element on which electrodes are formed and FIG. 15B is a sectional view taken along lines A-A' of FIG. 15A. Each of the main surfaces 11 disposed on two sides of the resonator element 10 has two grooves, the inside groove 13 and the outside groove 14, in enclosure shapes that surround the center portion 12 of the main surface 11 and are substantially along the outer shape of the resonator element 10. Excitation electrodes 60 for producing the thickness shear vibration are formed on two sides of the center portion 12 of the resonator element 10. The excitation electrodes 60 are formed in a rectangular shape except the peripheral portion of the center portion 12. A supporting electrode 61, which extends from the excitation electrode 60 toward the outer peripheral portion of the resonator element 10 and is connected to the outside, is formed.

An excitation electrode may be formed such that the range is expanded to a part of grooves or all grooves.

Figure 16A:
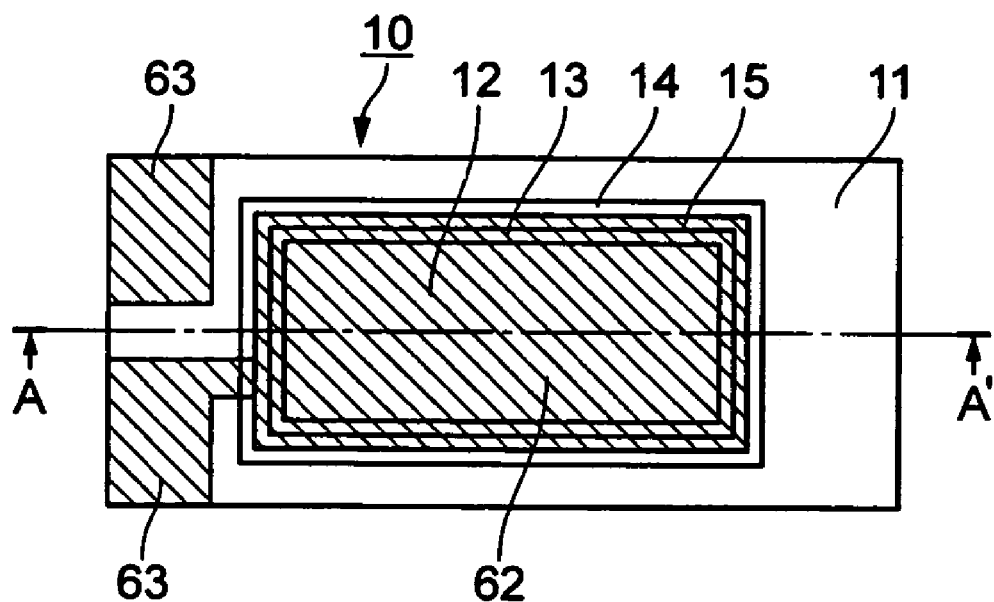
FIGS. 16A and 16B are schematic views of a resonator element for explaining another example of a fifth exemplary embodiment of the invention.
Figure 16B:
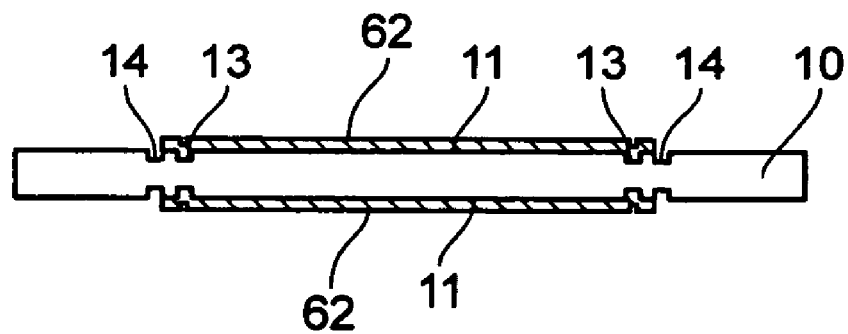

FIG. 16A is a plan view of the resonator element on which electrodes are formed and FIG. 16B is a sectional view taken along lines A-A' of FIG. 16A.

Each of the main surfaces 11 disposed on two sides of the resonator element 10 has two grooves, the inside groove 13 and the outside groove 14, in enclosure shapes that surround the center portion 12 of the main surface 11 and are substantially along the outer shape of the resonator element 10. Excitation electrodes 62 expand through the center portion 12 and the groove 13 to an intermediate portion 15 between the groove 13 and the groove 14, and are formed in a rectangular shape. A supporting electrode 63, which extends from the excitation electrodes 62 formed on two sides of the resonator element 10 toward the outer peripheral portion of the resonator element 10 and is connected to the outside, is formed.

By forming an excitation electrode for producing the thickness shear vibration and a supporting electrode connected from the excitation electrode in an arbitrary shape on two sides of the resonator element in this manner, the above-described effect of the resonator element can be obtained. That is, propagation of the main vibration to the outer peripheral portion of the resonator element is suppressed, and the vibration can therefore be dampened up to the level at which the displacement amount in the edge portion of the resonator element does not affect the main vibration.

Figure 17A:
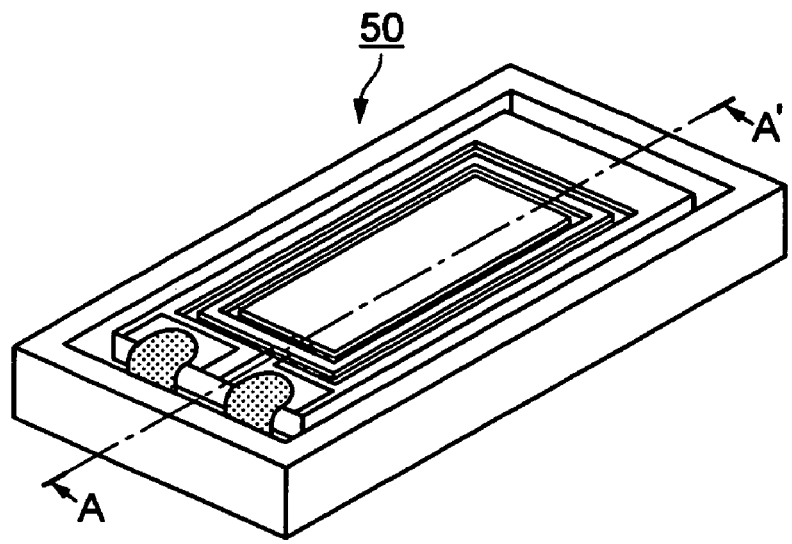
FIGS. 17A and 17B are schematic views showing a piezoelectric resonator according to the invention.
Figure 17B:
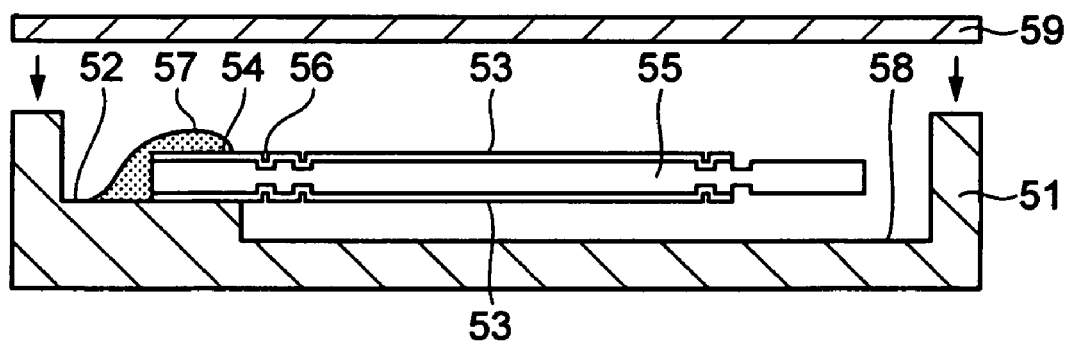

A piezoelectric resonator using a piezoelectric resonator element according to the present invention is shown in FIGS. 17A and 17B, and explained. FIGS. 17A and 17B are schematic views of the piezoelectric resonator; 17A is a perspective view of the piezoelectric resonator and FIG. 17B is a sectional view taken along lines A-A' of FIG. 17A.

In a piezoelectric resonator 50 according to the present invention, a resonator element 55 is fixed to a base 52 of a package (housing) 51 made of, for example, ceramic, while electrically connected by a conductive adhesive 57 or the like. An excitation electrode 53 formed in an arbitrary shape for producing the thickness shear vibration, a supporting electrode 54 for an external connection connected from the excitation electrode 53, and a groove 56 in an enclosure-like shape surrounding the center portion of the main surface for suppressing propagation of the thickness shear vibration to the outer peripheral portion are formed in the main surface of the resonator element 55. A bottom portion 58 of the package 51 is a concave structure so that the portions except the base 52, to which the resonator element 55 is fixed and connected, do not contact the resonator element 55. Moreover, a cover 59 is jointed to the top surface of the package 51 to maintain the airtightness.

In the piezoelectric resonator of the present embodiment, the resonator element 55 can dampen the vibration up to the value of not affecting the thickness shear vibration, which is the main vibration, in the outer peripheral portion in every direction of the resonator element 55 by the groove 56 in an enclosure-like shape surrounding the center portion of the resonator element 55. The usage of the resonator element 55 enables continuance of the stable vibration that does not have an effect on the characteristics of the main vibration, even though the outer peripheral portion of the resonator element 55 is fixed and connected to the package 51. The piezoelectric resonator 50 having good vibration characteristics such as being able to obtain a large frequency variable range can also be provided.

Figure 18A:
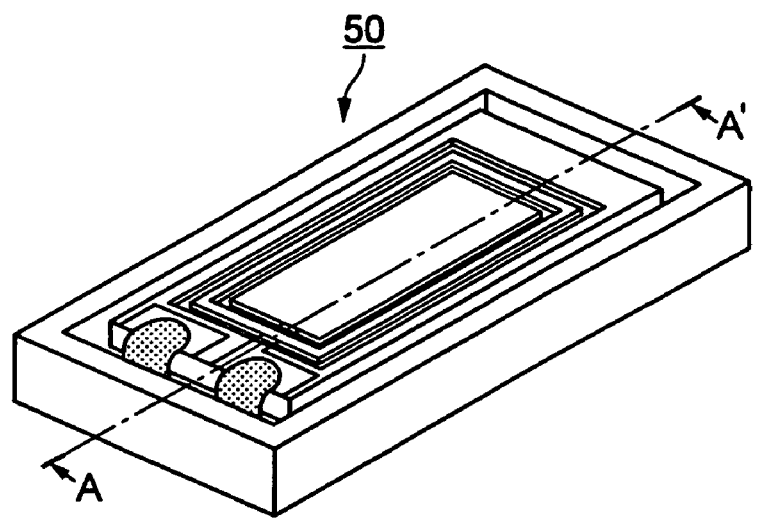
FIGS. 18A and 18B are schematic views showing a piezoelectric oscillator according to the invention.
Figure 18B:
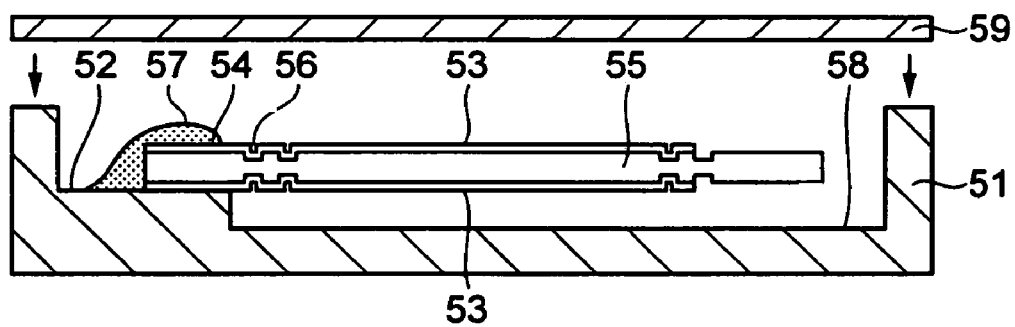

A piezoelectric oscillator using a piezoelectric resonator element according to the invention will be described in FIGS. 18A and 18B. FIGS. 18A and 18B are schematic views of the piezoelectric oscillator; 18A is a perspective view of the piezoelectric oscillator and FIG. 18B is a sectional view taken along lines A-A' of FIG. 18A.

In a piezoelectric oscillator 70 according to the invention, a resonator element 77 is fixed to a base 72 of a package (housing) 71 made of, for example, ceramic, while electrically connecting by a conductive adhesive 78 or the like. An excitation electrode 74 formed in an arbitrary shape for producing the thickness shear vibration, a supporting electrode 75 for an external connection connected from the excitation electrode 74, and a groove 76 in an enclosure-like shape surrounding the center portion of the main surface for suppressing the propagation of the thickness shear vibration to the outer peripheral portion are formed in the main surface of the resonator element 77. An operating circuit portion 80 that is electrically connected to the resonator element 77 and has a function of making at least the resonator element 77 operate is fixed to a bottom portion 79 of the package 71. The bottom portion 79 of the package 71 is a concave structure having the depth at which the resonator element 77 and the operating circuit 80 do not contact each other, except the base 72 to which the resonator element 77 is fixed and connected. Moreover, the resonator element 77 and the operating circuit portion 80 are contained by an airtight cover 81 jointed to a top surface of the package 71.

In the piezoelectric oscillator of the present embodiment, the resonator element 77 can dampen the vibration up to the value not affecting the thickness shear vibration, which is the main vibration, in the outer peripheral portion in every direction of the resonator element 77 by the groove 76 in an enclosure-like shape surrounding the center portion of the resonator element 77. The usage of the resonator element 77 enables continuance of the stable vibration that does not have an effect on the characteristics of the main vibration, even though the outer peripheral portion of the resonator element 77 is fixed and connected to the package 71. The piezoelectric oscillator 70 having good vibration characteristics such as being able to obtain a large frequency variable range can also be provided.

Incidentally, although description has been given by taking an example of quartz crystal as a material of the piezoelectric resonator element in the above embodiments, the embodiments can be practiced to obtain the similar effect using other piezoelectric materials such as lithium tantalite, lithium niobate, and PZT.

While this invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A piezoelectric resonator element, comprising:
   main surfaces on which an excitation electrode that causes a vibration of a piezoelectric substrate is formed on two sides of the piezoelectric substrate such that a thickness shear vibration is a main vibration; and
   a plurality of grooves that suppress propagation of the thickness shear vibration from a center portion to an outer peripheral portion of the main surface that are disposed in enclosure-like shapes surrounding the center portion of at least one of the main surface, further comprising:
   a groove that is different from one groove that is disposed along a part of the one groove in a direction of supporting the piezoelectric resonator element.

2. The piezoelectric resonator element according to claim 1, further comprising:
   the plurality of grooves being formed such that a groove width becomes successively wider as the groove moves from a groove nearest the center portion toward the outer peripheral portion.

3. A piezoelectric resonator element, comprising:
   main surfaces on which an excitation electrode that causes a vibration of a piezoelectric substrate is formed on two sides of the piezoelectric substrate such that a thickness shear vibration is a main vibration;
   a groove that suppresses propagation of the thickness shear vibration to an outer peripheral portion of the main surface being placed in an enclosure-like shape surrounding the center portion of at least one of the main surfaces; and
   a width of the groove being equal to or greater than a thickness of the piezoelectric substrate, further comprising:
   a groove that is different from one groove that is disposed along a part of the one groove in a direction of supporting the piezo electric resonator element.

4. The piezoelectric resonator element according to claim 1, further comprising:
   an excitation electrode in an arbitrary shape and a supporting electrode coupled to the excitation electrode that is formed at least on the center portion of the main surface of the piezo electric resonator element.

5. A piezoelectric resonator, comprising:
   the piezoelectric resonator element according to claim 4, and
   a holding portion that fixes and couples the piezoelectric resonator element.

6. A piezoelectric oscillator, comprising:
   the piezoelectric resonator element according to claim 4,
   a circuit portion that drives the piezoelectric resonator element; and
   a holding portion having a fixing portion that fixes and couples the piezoelectric resonator element and the circuit portion.

7. The piezoelectric resonator element according to claim 3, further comprising:
   an excitation electrode in an arbitrary shape and a supporting electrode coupled to the excitation electrode that is formed at least on the center portion of the main surface of the piezoelectric resonator element.

8. A piezoelectric resonator, comprising:
   the piezoelectric resonator element according to claim 7, and
   a holding portion that fixes and couples the piezoelectric resonator element.

9. A piezoelectric oscillator, comprising:
   the piezo electric resonator element according to claim 7,
   a circuit portion that drives the piezoelectric resonator element; and
   a holding portion having a fixing portion that fixes and couples the piezoelectric resonator element and the circuit potion.

* * * * *